United States Patent
Pearl et al.

(10) Patent No.: US 6,545,275 B1
(45) Date of Patent: Apr. 8, 2003

(54) BEAM EVALUATION

(75) Inventors: Asher Pearl, Hod-Hasharon (IL); Nadav Haas, Merkaz-Shapira (IL); Yacov Elgar, Yavne (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/390,002

(22) Filed: Sep. 3, 1999

(51) Int. Cl.⁷ .................... G01N 23/00; G21K 7/00; H01J 37/29
(52) U.S. Cl. ................ 250/310; 250/307; 250/443.1
(58) Field of Search ................ 250/307, 310, 250/397, 491.1, 443.1

(56) References Cited

U.S. PATENT DOCUMENTS

| | | | |
|---|---|---|---|
| 3,919,558 A | | 11/1975 | Brouillette et al. ......... 250/443 |
| 4,068,381 A | * | 1/1978 | Ballard et al. ............. 250/310 |
| 4,567,364 A | * | 1/1986 | Kano et al. ............... 250/310 |
| 4,789,781 A | * | 12/1988 | Kitagawa et al. ........ 250/443.1 |
| 5,043,586 A | * | 8/1991 | Giuffre et al. ........... 250/491.1 |
| 5,528,047 A | * | 6/1996 | Nakajima ................. 250/310 |
| 5,606,168 A | * | 2/1997 | Chiron et al. .......... 250/443.1 |
| 5,777,327 A | * | 7/1998 | Mizuno ..................... 250/310 |
| 6,169,282 B1 | * | 1/2001 | Maeda et al. ............. 250/310 |

FOREIGN PATENT DOCUMENTS

| | | | |
|---|---|---|---|
| EP | 0877409 | 11/1998 | ............ H01J/37/28 |
| EP | 1 081 742 A2 | * 3/2001 | |

* cited by examiner

Primary Examiner—Bruce Anderson
(74) Attorney, Agent, or Firm—Michael B. Einschlag

(57) ABSTRACT

The present invention provides, according to a first aspect, a method for automatically evaluating the performance of a charged particle device. The method uses a signal coming from a gold-on-carbon reference target. From this signal the spot size of the particle beam is determined. The method according to the present invention has the advantage that it does not depend on operator judgment. Therefore, the method leads to improved consistency, accuracy and reliability of the beam characterization, and, accordingly, to a better characterization of the quality of the system's performance.

22 Claims, 6 Drawing Sheets

BEAM EVALUATION

FIELD OF THE INVENTION

The invention relates to a method for evaluating a charged particle beam and a method for controlling a charged particle beam. Furthermore, this invention relates to an apparatus for the examination of specimen with a beam of charged particles.

BACKGROUND OF THE INVENTION

Due to their high resolving power, beams of charged particles are used for the examination of specimen. Compared to optical light, the resolving power of a beam of charged particles is several magnitudes higher and allows for the examination of much finer details. Accordingly, charged particle beams, especially electron beams, are used for the inspection of masks and wafers used in semiconductor technology, which requires a very high resolution.

For an instrument using charged particles, for example a scanning electron microscope (SEM), it is important to characterize and to control the instrument's quality of performance. Charged particle devices, like scanning electron microscopes, are sensitive to noise of all kinds, such as mechanical, acoustical or electromagnetic noise. Furthermore, internal instabilities and differences in the adjustments from one operator to the next may lead to a serious degradation of the system performance. Accordingly, the performance of the system has to be checked on a regular basis in order to guarantee an operation of the system according to the specifications. Especially, for those systems that are used to measure in line the quality of a production process, for example in the semiconductor industry, the performance of the entire system must be checked at least every day.

However, it is very difficult to determine the quality of system performance. Conventionally, the corresponding tests are performed manually by well-trained operators who can judge the system's performance based on their own experience. The image quality, for example, is determined by comparing an image of a resolution target to a reference hard copy image. However, it is difficult to judge the quality of the resulting pictures by eye vision alone and each operator tends to judge picture quality by different criteria. Furthermore, the resolution of a system is normally determined by measuring the smallest distance between two edges in the image having the same background gray level between them. Searching for the smallest distance between two edges, however, does not lead to consistent results either, because the measurement locations are random and suitable measurement locations are very rare. Accordingly, the manual approach of evaluating the system's performance is highly dependent on operator judgment and the chosen field of vision. It introduces operator inaccuracies and inter-operator variations. Accordingly, there is a need for a more accurate, more consistent, and automated method for the characterization and/or the control of a charged particle beam.

SUMMARY OF THE INVENTION

The present invention provides a method for automatically evaluating the performance of a charged particle device. The method uses a signal coming from a reference resolution target. From this signal the spot size of the particle beam is determined. The method according to the present invention has the advantage that it does not depend on operator judgment. Therefore, the method leads to improved consistency, accuracy and reliability of the beam characterization, and, accordingly, to a better characterization of the quality of the system's performance. Furthermore, the method according to the invention does not require an unique scan pattern on the sample, so that the method can be executed within existing instruments, for example scanning electron microscopes, with minimal modification. Suitable measurement locations are not dependent on a unique event (smallest distance between two edges). Accordingly, the results of the measurement do not depend on the chosen location. The spot size of the particle beam determines significantly the system resolution, image contrast and measurement quality. Accordingly, the determination the spot size of the particle beam leads to a good and very useful characterization of the charged particle beam and a very good quality control of the system performance.

Preferably, metal-on-carbon targets or porous silicon targets are used as a reference resolution target. Metal-on-carbon targets are basically contrast targets where small islands of metal with a high yield of secondary electrons are located on a surface of carbon with a low yield of secondary electrons. Metal-on-carbon targets basically do not have any additional surface topography which could have a negative influence on the determination of the spot size of the particle beam. Furthermore, metal-on-carbon targets have very sharp edges, which allows the determination of the beam spot size with high precision. Metal-on-carbon targets are also insensitive to charged particle bombardments, especially electron bombardments, and they exhibit a long term stability in their secondary electron emission behavior. These features make a metal-on-carbon target an excellent tool for the automatic determination of the beam spot size. Preferred metals for the use in a metal-on-carbon target include gold, tin or aluminum.

Porous silicon reference targets are basically topography targets where due to an aggressive etch treatment the silicon exhibits are highly structured surface including very steep edges. These very steep edges also allow the determination of the beam spot size with high precision. Porous silicon reference targets are also insensitive to charged particle bombardments, especially electron bombardments, and they exhibit a long term stability in their secondary electron emission behavior.

According to a further aspect of the present invention, there is provided a method for controlling a charged particle device. The method uses the above described evaluation of the system performance in order to find the correct parameter setting. Based on the improved consistency, accuracy and reliability of the beam characterization, the beam control also exhibits a higher level of consistency, accuracy and reliability, so that high quality measurements can be guaranteed over a long period of time without any interference from outside.

According to a still further aspect of the present invention, there is provided a target assembly for use in a charged particle apparatus, said target assembly comprises: a target support for supporting a target; a housing carrying the target support and having a higher thermal mass than the target support; and a heating element for heating the target. By heating the target, contaminates absorbed by the target are evaporated and thereby removed from the surface of the target. This guarantees a precise beam characterization over a long time period even in a production environment. The target is cleaned without the need to open the instrument.

Accordingly, the down time of the instrument is reduced. Furthermore, the heating of the target reduces charging effects on the target. After the contaminates have been removed, the target cools down to room temperature, in order to perform the actual measurement.

By providing a housing, that carries the target support and that has a higher thermal mass than the target support, no excessive heat is transferred from the target support to neighboring elements and the surroundings. Accordingly, the heating of the target does not interfere with the normal operation of the instrument further reducing the idle time of the instrument

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
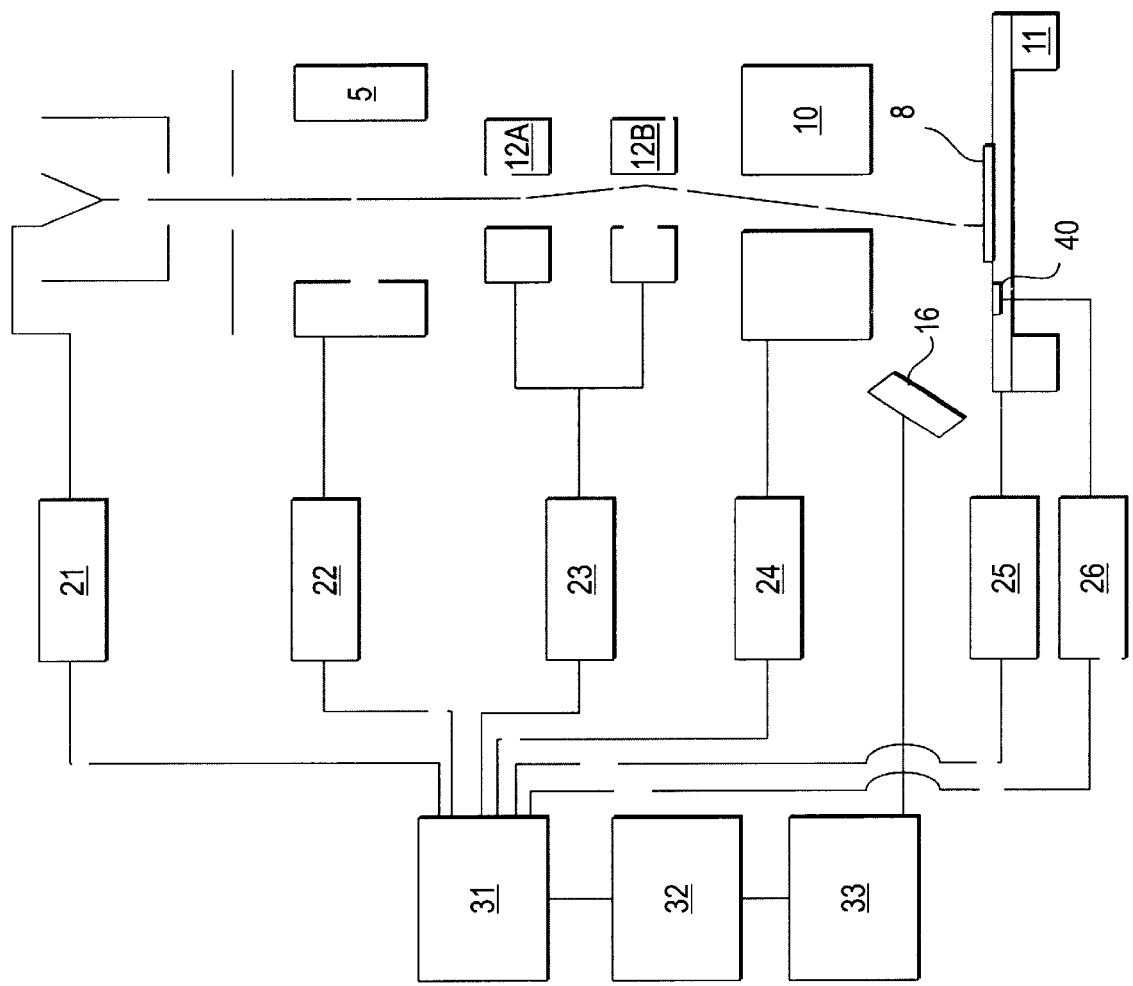
FIG. 1 is a block diagram of an charged particle apparatus according to an embodiment of the present invention.

Preliminary, it should be appreciated by those skilled in the art that the present invention can be used with any charged particle device. However, for convenience, then invention will be described with respect to its implementation in an scanning electron microscope (SEM). A preferred embodiment according to the invention is shown schematically in FIG. 1. A device as shown in FIG. 1 may, for example, be used to monitor the quality of the wafer processing in the semiconductor industry. Thereby, the device is actually located within the production environment, so that problems of the wafer processing are recognized as soon as possible. In order to examine a specimen, for example a semiconductor wafer, an electron beam 4 is emitted from the electron source 2. The electron source may, for example, be a tungsten-hairpin gun, or a lanthanum-hexaboride gun, or a field-emission gun. Once the electrons are released from the electron source 2, the electrons are accelerated by an accelerating voltage supplied to the electron source 2 by a high voltage supply unit 21. The electron beam 4 is then guided through a condenser lens 5, which demagnifies the beam and leads the electron beam 4 towards a specimen 8. The electron beam 4 then enters the scanning coils 12A and 12B, which are used to move the electron beam 4 over the specimen 8. The scanning coils 12A and 12B are followed by the objective lens 10 that focuses the electron beam 4 onto the specimen 8.

When the electrons strike the surface of the specimen 8, a variety of secondary products, such as electrons of different energy, X rays, light, and heat, as well as electrons scattered backward are produced. Many of these secondary products and/or the backscattered charged particles are used to produce the image of the specimen and to collect additional data from the specimen. A secondary product of major importance to examination or the image formation of specimens are secondary electrons that escape from the specimen 8 at a variety of angles with relatively low energy (3 to 50 eV). The secondary and the back scattered electrons reach the detector 16 and are measured. By scanning the electron beam over the specimen and displaying/recording the output of the detector 16 an image of the surface of the specimen 8 is formed.

The specimen 8 is supported on a stage 11 (specimen support) which is moveable in all directions, in order to allow the electron beam 4 to reach the target areas on the specimen which are to be examined. The specimen may, for example, be a semiconductor wafer which carries a plurality integrated circuits. Integrated into the stage 11 is the target assembly 40 that is used from time to time in order to evaluate the device performance. Preferably the target assembly 40 contains a gold-on-carbon target 50 (see FIG. 2).

In order to operate the apparatus shown in FIG. 1, the different elements of the apparatus are connected to corresponding supply units, the high voltage supply unit 21, the condenser lens supply unit 22, the scanning coil supply unit 23, the objective lens supply unit 24, the stage supply unit 25 and the target assembly supply unit 26, which are controlled by the parameter adjustment unit 31. The parameter adjustment unit 31 is connected with the analyzing unit 32, so that, based on the analysis performed by the analyzing unit 32, the parameters of the apparatus can be adjusted to maintain a predetermined level of performance. The analyzing unit 32 is also connected to the determination unit 33, which receives the image signal from the detector 16.

The determination unit 31 determines the spot size of the charged particle beam 4 based on the image signal produced by scanning over the target 50 supported by the target assembly 40. Furthermore, the determination unit 31 determines additional image parameters to quantify the performance of the system. Suitable image parameters include the center of the gray level histogram, the contrast of the image, the signal to noise ratio, the percentage of image gray level, and the percentage of blank or saturated pixels.

Figure 2:
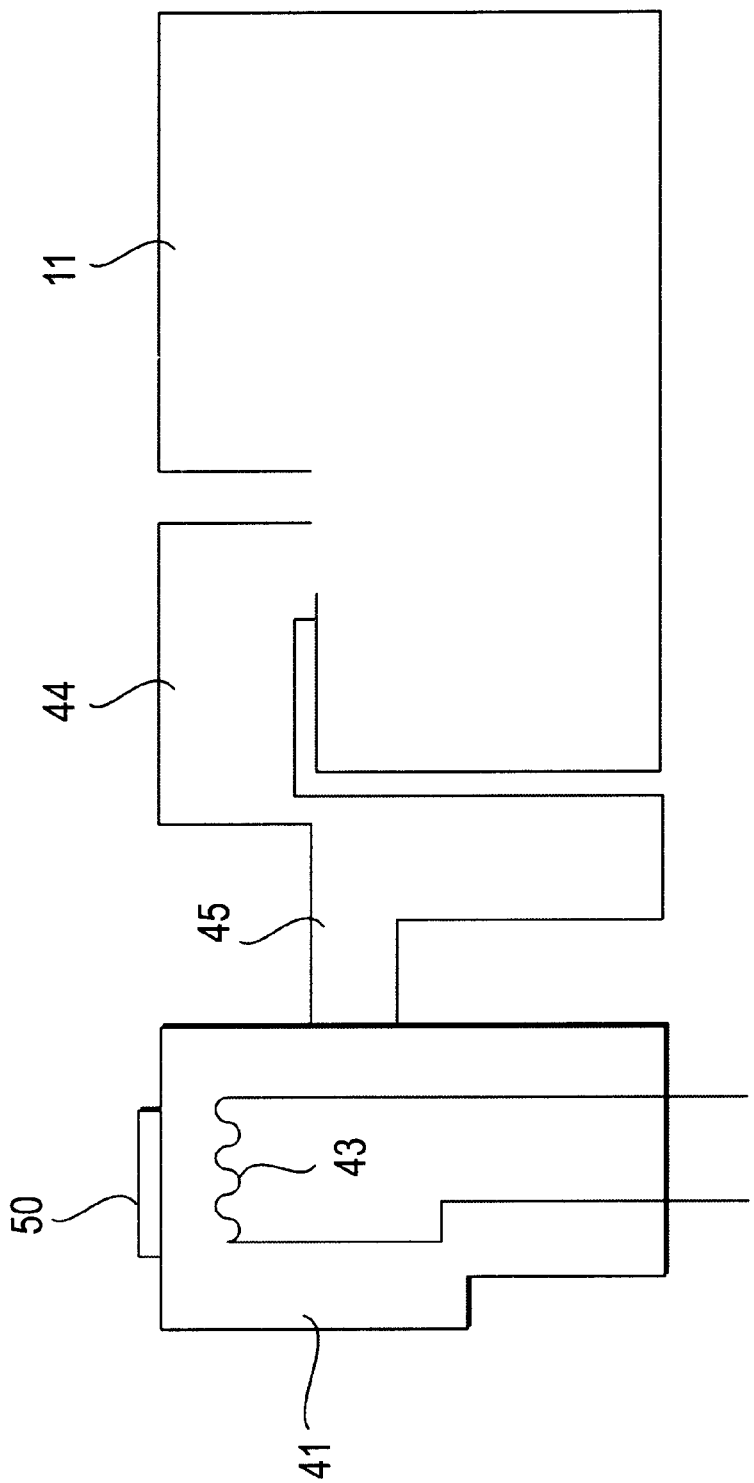
FIG. 2 is a schematic vertical cross section of a target assembly according to the present invention.

FIG. 2 is a schematic vertical cross section of the target assembly 40 according to the present invention. The gold-on-carbon target 50 is supported by target support 41. In order to keep the gold-on-carbon target 50 in a defined position with regard to the target support 41, the gold-on-carbon target 50 is glued to target support 41 by means of a conductive adhesive. By using a conductive adhesive problems connected with an unintentional charging of the gold-on-carbon target can be reduced or completely avoided. The target support 41 is made of stainless steel and exhibits a low thermal mass, so that it can be heated easily using only a small amount of energy. The heating is achieved by supplying an electric current to the heating element 43 located just below the gold-on-carbon target 50. The electric current is provided by the target assembly supply unit 26 which is controlled by the parameter adjustment unit 31 (FIG. 1).

The target support 41 is mechanically connected to a housing 44, which carries the target support 41. The mechanical connection between the target support 41 the housing 44 is established by a bridging element 45. The housing 44 exhibits a thermal mass which considerably higher than the thermal mass of the target support 41. Accordingly, during the heating of the gold-on-carbon target 50 the housing 44 remains considerably cooler than the target support 41, so that only a small amount of heat is transferred from the target support 41 to stage 11. The temperature of the stage 11 and the specimen 8 remains basically unchanged, so that the heating of the target 50 has no negative side effects on the normal operation of the apparatus. Therefore, the gold-on-carbon target 50 can be cleaned during the actual examination of a specimen 8. There is no need to open the apparatus and the vacuum level within the apparatus can be maintained. Accordingly, the idle time of the apparatus is reduced and the throughput of the apparatus is increased.

Figure 3:
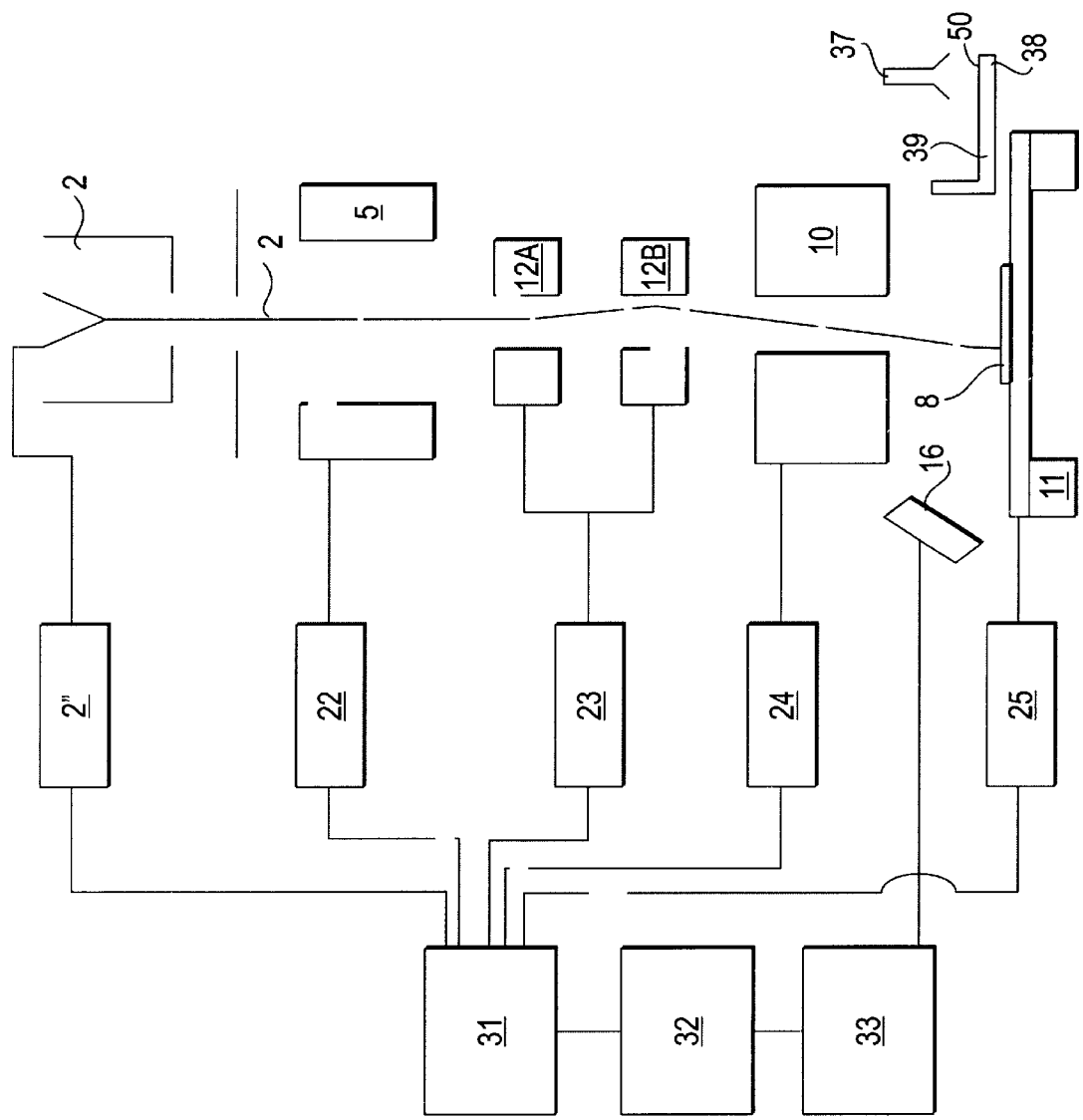
FIG. 3 is a block diagram of an charged particle apparatus according to an further embodiment of the present invention.

FIG. 3 shows a block diagram of an apparatus according to a further embodiment of the present invention. This embodiment is similar to that of FIG. 1, except for the following. In this embodiment the target assembly is not integrated into the stage 11 but is provided as a separate entity. Furthermore, the heating element is not integrated into the target support. In this embodiment the heating element is lamp heater 37 which is located above a parking position of the target support 38. When the reference resolution target 50 which is fixed to the target support 38 is needed to evaluate the performance of the device, the lamp heater heats 37 the target so that contaminants present on the surface of the reference resolution target are evaporated. In order remove the contaminants in a fast manner, a suction tube (not shown) is located near the parking position of the reference resolution target 50.

Once the reference resolution target has cooled down, the reference resolution target 50 is brought into the scanning range of the electron beam 4 so that the beam evaluation can be performed. This achieved by rotating the housing 39 which carries the target support 38 from the parking position to the measurement position as indicated by the dotted line.

Figure 4A:
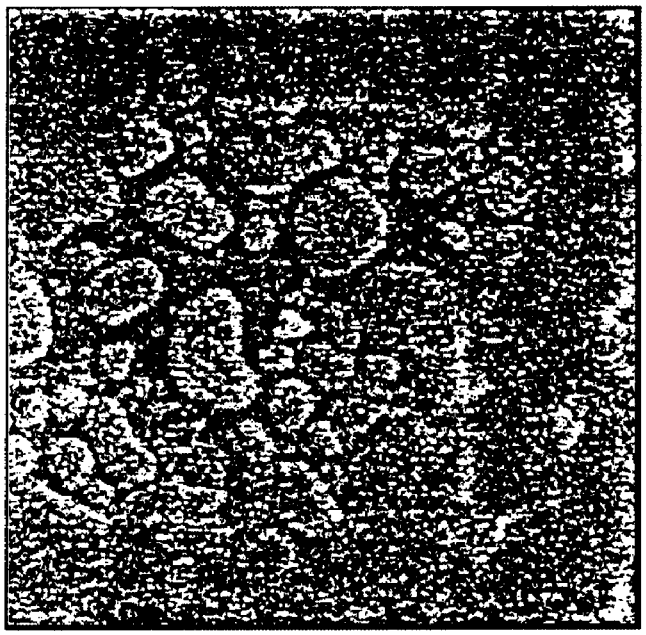
FIG. 4A and FIG. 4B illustrate the positive effects of the heating of the gold-on-carbon target.
Figure 4B:
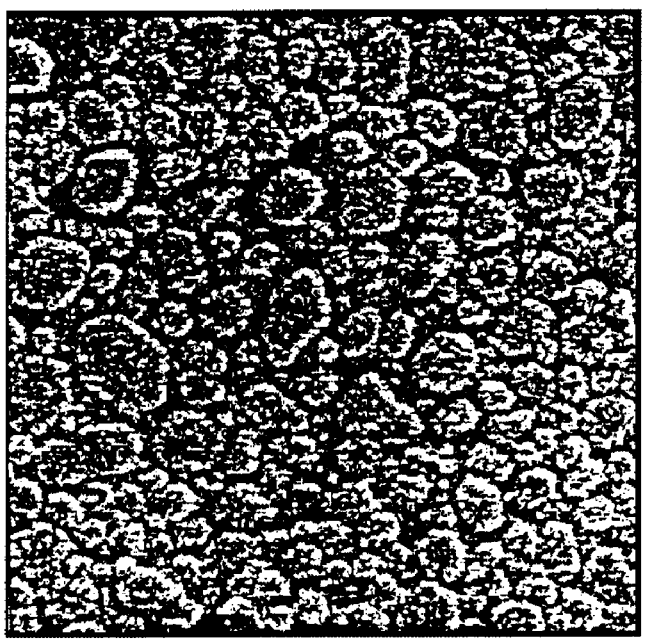

FIG. 4A and FIG. 4B illustrate the positive effects of the heating of the gold-on-carbon target. FIG. 4A shows the SEM picture of an gold-on-carbon target that has not been heated before the picture was taken. FIG. 4A clearly shows a blackening of the gold-on-carbon target caused by contaminants. Obviously, this type of blackening would render the gold-on-carbon target useless for the purpose of evaluating the device performance.

In contrast thereto, FIG. 4B shows the SEM picture of an gold-on-carbon target that has been heated to temperature of about 150° C. before the picture was taken. The gold-on-carbon target was heated to the temperature of about 150° C. during a time period of about 10 min. Thereafter, the gold-on-carbon target cooled down to room temperature before the picture was taken. The picture does not show any blackening which indicates that the heating basically has removed all contaminants. This guarantees a long term beam characterization without the need to open the instrument. Accordingly, the down time of the instrument is reduced.

Figure 5:
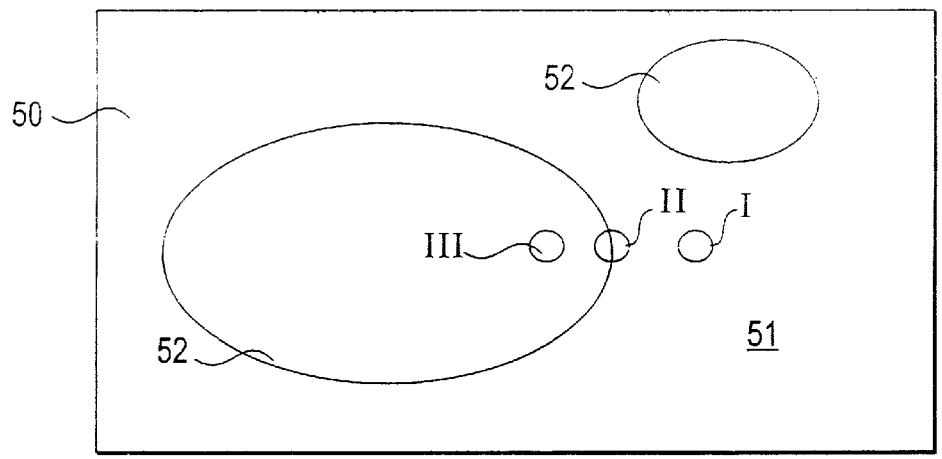
FIG. 5 shows a situation when an electron beam is scanned over a single pattern of a gold-on-carbon target.

In order to characterize the system's performance the spot size of the electron beam has to be evaluated. In one preferred embodiment of the present invention secondary electrons coming from the gold-on-carbon target are detected. FIG. 5 shows a situation when an electron beam is scanned over a single pattern of a gold-on-carbon target.

Thereby, the electron beam is scanned from a position I to a position III via an intermediate position II. At position I, the entire electron beam hits carbon portion 51 of the gold-on-carbon target 50. Due to fact that carbon has a low yield of secondary electrons, only a few secondary electron are emitted from the surface of the target. At the position II, about one half of the electron beam hits gold portion 52 of the gold-on-carbon target 50 whereas the other half of the electron beam hits carbon portion 51 of the gold-on-carbon target 50. Due to fact that gold has a high yield of secondary electrons, the number of secondary electron, that are emitted from the surface of the target, increases. At position III, the entire electron beam hits gold portion 52 of the gold-on-carbon target 50. Accordingly, the number of secondary electron, that are emitted from the surface of the target, reaches its maximum.

Figure 6:
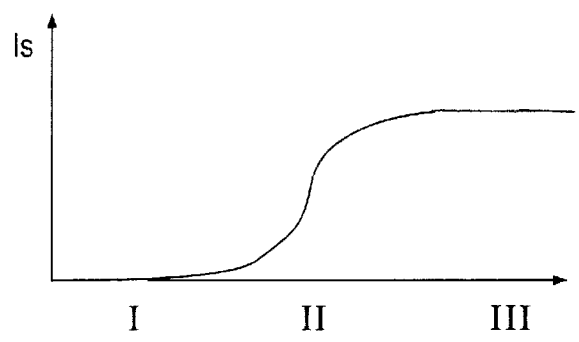
FIG. 6 is a graph illustrating this variation of the current $I_S$ representative of the number of secondary electrons while scanning from the position I to the position III in FIG. 5.
Figure 7:
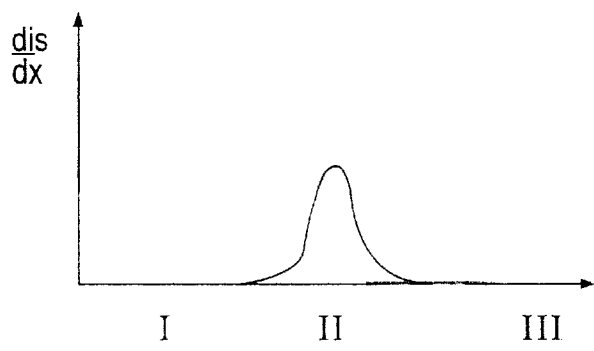
FIG. 7 is a graph representing the first derivative $dI_S/dx$ of the curve $I_S$ shown in FIG. 6.

FIG. 6 is a graph illustrating this variation of the current $I_S$ representative of the number of secondary electrons while scanning from the position I to the position III. FIG. 7 is a graph representing the first derivative $dI_S/dx$ of the curve $I_S$ shown in FIG. 6. As can be seen, the first derivative is zero at both ends and becomes maximum at the position II. The width of the first derivative represents the width of the electron beam and the spot diameter in the scanning direction. Especially, the width of the interval under the peak between the zero values can be used as the electron beam width.

Figure 8:
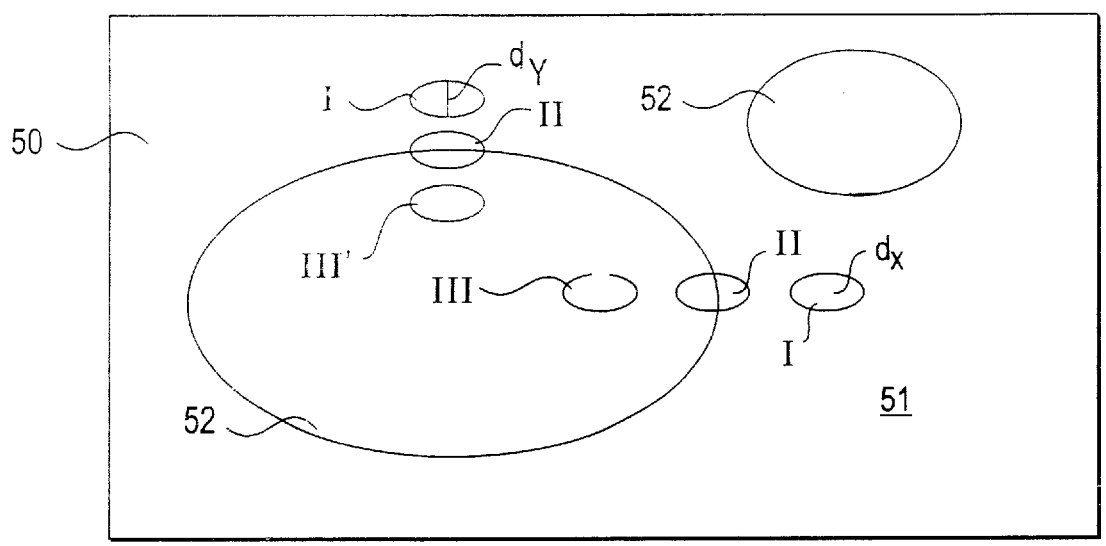
FIG. 8 shows a situation when an electron beam is scanned over a single pattern of a gold-on-carbon target in the vertical as well as the horizontal direction.

It may happen that the beam spot does not exhibit a circular shape but has an elliptical shape. FIG. 8 shows an example of an oblong spot whose diameter in the Y direction is smaller than the diameter in the X direction. In order to evaluate the performance of the system correctly, the beam is scanned over the gold-on-carbon target 50 in the X direction (positions I, II, III) as well as in the Y direction (positions I', II', III'). By using the same method as described with regard to FIGS. 6 and 7 twice, the diameter $d_x$ (X direction) and the diameter $d_y$ (Y direction) can be determined. With the knowledge of these two diameters, for example, the astigmatism of the system can be determined and eventually corrected. Since it is not known in advance whether or not the beam spot shows an elliptical shape, it is preferred that the charged particle beam is scanned in the vertical and in horizontal direction.

The same results (diameter $d_x$ and diameter $d_y$) can be achieved by scanning the gold-on-carbon target 50 only in one direction, for example the X direction. By scanning over the target along a plurality of parallel scan lines a two dimensional image of the target is produced. This two dimensional image of the target can then be analyzed along a line which is perpendicular to the scan lines (Y direction). Along this line the image basically contains the same information as if the beam would have been scanned over the target along this line. Accordingly, the diameters $d_x$ and $d_y$ can be determined. Furthermore, the two dimensional image of the target can be analyzed along any line, so that the beam diameter in any direction can be determined.

In the previous example the size of the beam spot was determined by examining the first derivative of the graph $I_S$. However, by using the Fourier transform of the graph $I_S$, which yields the weight of high frequencies corresponding to sharp edges, the beam spot can also be determined.

In order to evaluate the performance of the system, image parameters which are directly connected with the produced image may also be used. An image usually comprises a plurality of pixels each of which exhibits a certain gray level. The number of different gray levels may, for example, be 256. When the number of pixels that exhibit a certain gray level is plotted versus the gray levels a histogram results. An important parameter for evaluating the quality of the image is the center of the gray level histogram. This parameter is calculated according to the following formula:

$$CEN = \Sigma_i(V_i i)/\Sigma V_i$$

where $V_i$ is the number of pixels exhibiting the gray level i, and i stands for ith gray level. The value of the CEN should not lie outside a certain range, otherwise the image is either too dark or too bright.

Figure 9:
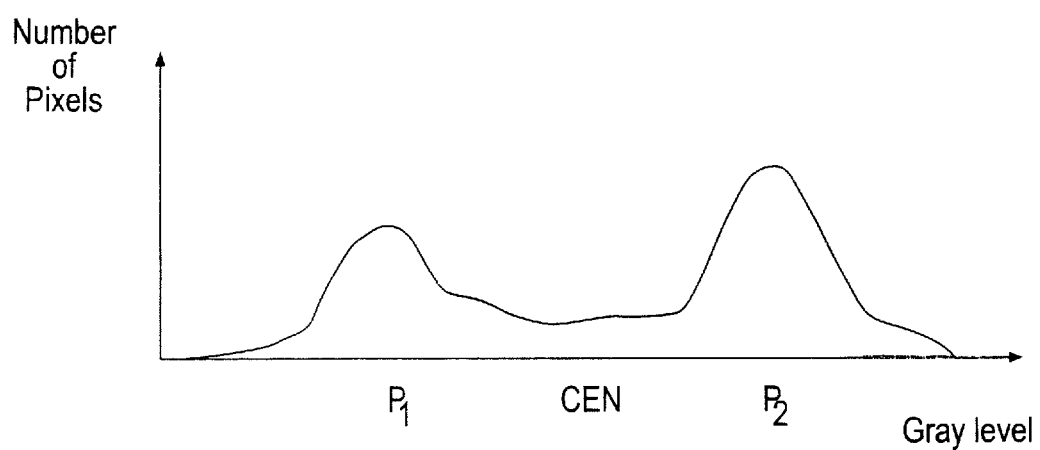
FIG. 9 shows an example for gray level histogram used to evaluate the device performance.

During normal operation of the device the gray level histogram usually exhibits two dominant points $P_1$ and $P_2$ on both sides of the center of the histogram. For example, if the gray level histogram has a saddle-like shape, as exemplified in FIG. 9, the dominant points are the peaks on both sides of the histogram center. The picture contrast is then proportional to difference of the two dominant points:

$$PC\ P_2-P_1$$

Obviously, images having a high picture contrast are preferred.

In order to find the noise in the image, those pixels that exhibit a gray level equal to the center of the gray level histogram are identified and for each of these pixels the differences between the gray levels of the surrounding pixels are calculated. Then, the maximum value of these differences is selected for each pixel (having a gray level equal to the center of the gray level histogram). From these maximal differences the lowest value is selected to represent the noise in the image. This procedure has the advantage that noise can be calculated by using only one image, whereas the usual noise formulas, which can also be used, require several images of the same scene in order to find a value for the noise in the picture. The signal to noise ratio is then given by the formula:

$$S/N = V_h/\text{noise}$$

where $V_h$ is the gray level having the highest pixel quantity (highest peak in the gray level histogram). Obviously, images having a high signal to noise ratio are preferred.

A further important parameter describing the quality of the picture is the percentage of the gray levels that are actually used in the image. The higher the percentage of image gray levels the better the quality of the picture. A parameter of similar type is the percentage of blank or saturated pixels. If this percentage exceeds a predetermined limit an adjustment of the brightness and the contrast of the image is necessary.

In the following the operation of the apparatus shown in FIG. 1 will be described. In the field of wafer processing it is essential that problems, which might occur during the whole production process, are detected as early as possible. For example the production of a DRAM chip requires about 600 production steps. In order to complete these 600 steps, a wafer may stay several weeks within the production line. If a problem which occurs within an early stage of the wafer processing remains undetected until the final check of the DRAM at the end of the complete process, a lot of time and a lot of wafers are wasted. Therefore, the apparatus shown in FIG. 1 examines in line selected wafers throughout the complete production process.

In order to guarantee a certain level of system performance, the system performance is evaluated from time to time. The evaluation can be done in fixed time intervals, for example every night at a predetermined time, after a predetermined number of examined wafers, or according to any other maintenance schedule. In order to perform the evaluation, the analyzing unit 32 causes the parameter adjustment unit 31 to generate a target heating signal which is supplied to the target assembly supply unit 26. Based on the target heating signal the target assembly supply unit 26 supplies a current to the heating element 43 within the target assembly integrated 40 into the stage 11.

The heating element 43 (see FIG. 2) heats the gold-on-carbon to a predetermined temperature, for example 150° C., so that contaminants present on the surface of the gold-on-carbon target 50 are evaporated. Due to the fact that housing 44 remains considerably cooler than the target support 41, only a small amount of heat is transferred from the target support 41 to stage 11. Accordingly, the temperature of the stage 11 and the specimen 8 remains basically unchanged, so that the heating of the target 50 has no negative side effects on the normal operation of the apparatus. Therefore, the gold-on-carbon target 50 can be cleaned without interrupting the examination of a specimen 8.

After a predetermined period of time, for example 10 minutes, the analyzing unit 32 causes the parameter adjustment unit 31 to generate a target cooling signal which is supplied to the target assembly supply unit 26. Based on the target cooling signal the target assembly supply unit 26 terminates its current supply to the heating element 43. Accordingly, the gold-on-carbon target cools down to room temperature so that the actual beam characterization can be performed. Depending on the size of the target this may take between 15 to 30 minutes. Once the gold-on-carbon target has reached room temperature, the analyzing unit 32 causes the parameter adjustment unit 31 to generate a move-stage signal which is supplied to the stage supply unit 25. Based on the move-stage signal the stage supply unit 25 moves the stage 11 so that the target assembly 40 comes into the scanning range of the electron beam 4.

The analyzing unit 32 then causes the parameter adjustment unit 31 to generate a scan signal which is supplied to the scanning coil supply unit 23. Based on the scan signal the scanning coil supply unit 23 causes the scanning coils 12A and 12B to move the electron beam 4 over the gold-on-carbon target 50 so that secondary electrons coming from the gold-on-carbon target are detected by the detector 16. The corresponding signal is supplied to the determination unit 31 which determines the spot size of the charged particle beam 4 as described with reference to the FIGS. 5 to 7. Furthermore, the determination unit 31 determines additional image parameters to quantify the performance of the system. Suitable image parameters include the contrast of the image, the center of histogram gray level, the signal to noise ratio, the percentage of image gray level, the percentage of blank pixels above a predetermined limit, the number of peak results per line test and the stigmation.

The spot size of the charged particle beam and the values of the image parameters are then printed out or stored in a computer, so that the operators of the device get a clear picture of the device performance. Furthermore, the results may also be used for statistical purposes in order to learn the long time behavior of the device.

According to a preferred embodiment, the results are also transferred to the analyzing unit 32, which compares the results with a predetermined device specification. Based on this comparison the analyzing unit 32 causes the parameter adjustment unit 31 to adjust at least one parameter affecting the performance of the charged particle device so that the charged particle device exhibits the predetermined characterization. If the predetermined system performance can not be reached by a single adjustment, the whole process can be repeated in form of a closed loop. The analyzing unit 32 may also store the results of the determination unit 31 so that a statistical evaluation of the system performance is possible.

Once a satisfactory level of performance has been reached, the analyzing unit 32 causes the parameter adjustment unit 31 to generate a further move-stage signal which is supplied to the stage supply unit 25. Based on the move-stage signal the stage supply unit 25 moves the stage 11 so that the target assembly 40 comes out of the scanning range of the electron beam 4 and the examination of wafers can be continued. Due to the improved consistency, accuracy and reliability of the beam characterization, the system performance also exhibits a higher level of consistency, accuracy and reliability, so that high quality measurements can be guaranteed over a long period of time without any interference from outside.

While the invention has been described with reference to three exemplary embodiments thereof, those of ordinary skill in the art would appreciate that various implementations and variations are possible without departing from the scope and spirit of the invention, as defined by the appended claims. For example, it should be readily apparent that the determination unit may use one or more of a plurality of different algorithms for determining the beam spot size, and these algorithms can be readily applied to any of the exemplary embodiments disclosed herein. Similarly, the various supply units are provided as examples only, and other combinations or types of supply units may be used.

What is claimed is:

1. A method for automatically evaluating a performance of a charged particle device using a charged particle beam for examination of a specimen, said method comprising steps of:
    a) providing an unstructured metal-on-carbon or a porous silicon reference resolution target;
    b) scanning the charged particle beam over the reference resolution target;
    c) measuring at least one secondary product and/or backscattered particles coming from the resolution target, to produce a signal; and
    d) determining a spot size of the charged particle beam from the signal in order to evaluate the performance of the charged particle device.

2. The method according to claim 1 wherein a gold-on-carbon, a tin-on-carbon, or an aluminum-on-carbon target is used as a metal-on-carbon target.

3. The method according to claim 1 wherein the charged particle beam is scanned over at least one sharp edge in the reference resolution target.

4. The method according to claim 1 wherein the reference resolution target has been heated to remove contaminates from the surface of the reference resolution target.

5. The method according to claim 4 wherein the reference resolution target has been heated to a temperature between 120° and 200° C.

6. The method according to claim 1 wherein a pattern of metal in the reference resolution target has a plurality of sharp edges and the charged particle beam is scanned in a vertical and in a horizontal direction.

7. The method according to claim 1 wherein the spot size of the charged particle beam in a scanning direction is determined by using a first derivative of the signal or a Fourier transform of the signal.

8. The method according to claim 7 wherein the spot size of the charged particle beam in the scanning direction is determined to be a width of a peak in a first derivative of the signal.

9. The method according to claim 1 wherein additionally at least one image parameter from the signal is determined.

10. The method according to claim 9 wherein the at least one image parameter is selected from a group of image parameters including a center of a gray level histogram, a contrast of an image, a signal to noise ratio, a percentage of image gray level, and a percentage of blank pixels.

11. A method for controlling a charged particle device using a charged particle beam for examination of a specimen comprising steps of:
    a) evaluating a performance of the charged particle device including steps of:
        scanning the charged particle beam over an unstructured metal-on-carbon or a porous silicon reference resolution target, measuring at least one secondary product and/or backscattered particles coming from the resolution target, to produce a signal, and determining a spot size of the charged particle beam from the signal to evaluate the performance of the charged particle device;
    b) analyzing the evaluation; and
    c) adjusting at least one parameter affecting the performance of the charged particle device so that the charged particle device exhibits a predetermined performance.

12. A charged particle apparatus for examination of a specimen comprising:
    a) a particle source for providing a beam of charged particles;
    b) an unstructured metal-on-carbon or a porous silicon reference resolution target;
    c) an objective for focusing the charged particle beam onto the specimen or onto the reference resolution target;
    d) a detector for measuring at least one secondary product and/or backscattered particles coming from the specimen or from the resolution target;
    e) a scanning unit for scanning the charged particle beam over the specimen or the reference resolution target, so that an image signal is generated; and
    f) a determination unit for determining at least one image parameter and/or a spot size of the charged particle beam based on the image signal produced by scanning over the reference resolution target to evaluate the performance of the charged particle device.

13. The charged particle apparatus according to claim 12 comprising a heating element for heating the reference resolution target.

14. The charged particle apparatus according to claim 12 wherein the reference resolution target is located on a target assembly comprising:
    a) a target support for supporting a target;
    b) a housing carrying the target support and having a higher thermal mass than the target support; and
    c) a heating element for heating the target.

15. The charged particle apparatus according to claim 14 wherein the specimen is supported on a specimen support and the target assembly is integrated into the specimen support.

16. The charged particle apparatus according to claim 14 wherein the target is fixed to the target support with a conductive adhesive.

17. The charged particle apparatus according to claim 14 wherein the housing carries the target support by means of a bridging element.

18. The charged particle apparatus according to claim 14 wherein the heating element is integrated into the target support.

19. A charged particle apparatus for examination of a specimen comprising:
- a) a particle source for providing a beam of charged particles;
- b) an unstructured metal-on-carbon or a porous silicon reference resolution target;
- c) an objective for focusing the charged particle beam onto the specimen or onto the reference resolution target;
- d) a detector for measuring at least one secondary product and/or backscattered particles coming from the specimen or from the resolution target;
- e) a scanning unit for scanning the charged particle beam over the specimen or the reference resolution target, so that an image signal is generated;
- f) a determination unit for determining at least one image parameter and/or a spot size of the charged particle beam based on the image signal produced by scanning over the reference resolution target;
- g) an analyzing unit for analyzing the at lest one image parameter or the spot size; and
- h) a parameter adjustment unit for generating at least one parameter changing signal to affect the charged particle beam so that the charged particle beam exhibits a predetermined characterization.

20. The charged particle apparatus according to claim 19 comprising a heating element for heating the reference resolution target.

21. The charged particle apparatus according to claim 19 wherein the reference resolution target is located on a target assembly comprising:
- a) a target support for supporting a target;
- b) a housing carrying the target support and having a higher thermal mass than the target support; and
- c) a heating element for heating the target.

22. The charged particle apparatus according to claim 21 wherein the specimen is supported on a specimen support and the target assembly is integrated into the specimen support.

* * * * *